(12) United States Patent
Kataoka et al.

(10) Patent No.: US 9,520,896 B1
(45) Date of Patent: Dec. 13, 2016

(54) NON-TRANSITORY COMPUTER-READABLE RECORDING MEDIUM, ENCODING METHOD, ENCODING DEVICE, DECODING METHOD, AND DECODING DEVICE

(71) Applicant: FUJITSU LIMITED, Kawasaki-shi, Kanagawa (JP)

(72) Inventors: Masahiro Kataoka, Kamakura (JP); Takaki Ozawa, Numazu (JP); Kohshi Yamamoto, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/187,979

(22) Filed: Jun. 21, 2016

(30) Foreign Application Priority Data

Jul. 13, 2015 (JP) .................. 2015-140067

(51) Int. Cl.
```
H03M 7/34    (2006.01)
H03M 7/00    (2006.01)
G06F 17/22   (2006.01)
H03M 7/40    (2006.01)
H04N 19/436  (2014.01)
H03M 7/30    (2006.01)
H04N 19/61   (2014.01)
```

(52) U.S. Cl.
CPC ............ *H03M 7/00* (2013.01); *G06F 17/2217* (2013.01); *G06F 17/2276* (2013.01); *H03M 7/30* (2013.01); *H03M 7/40* (2013.01); *H04N 7/26755* (2013.01); *H04N 7/50* (2013.01)

(58) Field of Classification Search
CPC ............ H03M 7/30; H03M 7/40; H04N 7/50; H04N 7/26755; G06T 9/005
USPC ... 341/50, 51, 65, 67, 87; 382/247, 233, 234
See application file for complete search history.

(56) References Cited

U.S. PATENT DOCUMENTS 6,026,198 A * 2/2000 Okada .................. G06T 9/005
                                             341/107
2002/0190877 A1   12/2002 Satoh
2003/0091241 A1    5/2003 Morihara et al.

FOREIGN PATENT DOCUMENTS

| JP | 5-241776   | 9/1993 |
|----|------------|--------|
| JP | 11-215007  | 8/1999 |
| JP | 2000-124810| 4/2000 |

* cited by examiner

*Primary Examiner* — Joseph Lauture
(74) *Attorney, Agent, or Firm* — Oblon, McClelland, Maier & Neustadt, L.L.P.

(57) ABSTRACT

An information processing device compares a particular unit including a plurality of words and each word corresponding to an encoded output previously output to an output buffer, when encoding an input text word by word and outputting the encoded input text to an output buffer, detects a duplicating part that includes the particular unit and performs dynamic encoding on the detected part to replace the detected part with a dynamic code.

12 Claims, 15 Drawing Sheets

FIG.12
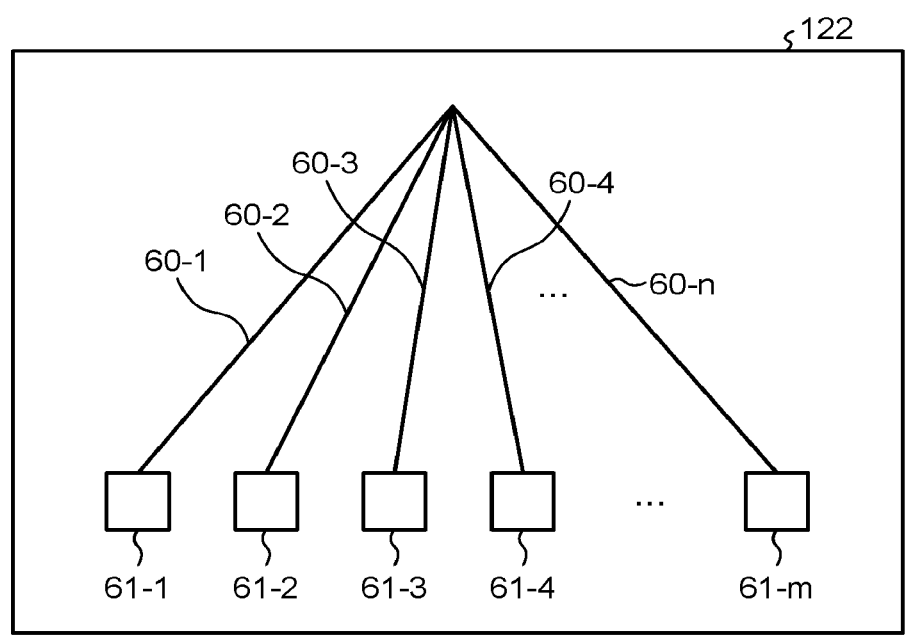
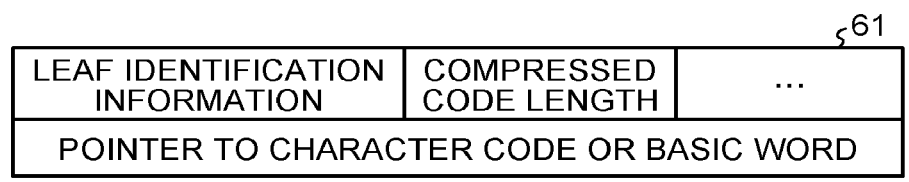

NON-TRANSITORY COMPUTER-READABLE RECORDING MEDIUM, ENCODING METHOD, ENCODING DEVICE, DECODING METHOD, AND DECODING DEVICE

CROSS-REFERENCE TO RELATED APPLICATION(S)

This application is based upon and claims the benefit of priority of the prior Japanese Patent Application No. 2015-140067, filed on Jul. 13, 2015, the entire contents of which are incorporated herein by reference.

FIELD

The embodiment discussed herein is generally related to an encoding program and a decoding program.

BACKGROUND

The conventional technique for compressing text data detects any string repeated in the text data and encodes the detected string. To encode a string having a plurality of words word by word, the string is replaced with a plurality of codes. For example, the conventional technology encodes the string of "Kanagawa Prefecture Kawasaki City Nakahara Ward" word by word for each of "Kanagawa", "Prefecture", "Kawasaki", "City", "Nakahara", and "Ward".

However, the conventional technology mentioned above does not improve compression efficiency.

For example, a technology such as the ZIP searches strings included in text data for a longest match string using a slide window and encodes the longest match string as a whole byte by byte. In this case, even when it is found that a longer string is available as the longest match string, it is impossible to change the longest match string held in the slide window. Thus, even when a higher compression efficiency is expected, this opportunity is not sufficiently exploited in some cases. For example, when a short part of a string is held in the slide window as the longest match string at the previous stage, this matching prevents a longer string from being held as the longest string in the slide window.

For this reason, a string including a plurality of words is preferably encoded as a whole, even after the string is encoded word by word so that the words are individually encoded.

SUMMARY

According to an aspect of an embodiment, a non-transitory computer-readable recording medium stores therein an encoding program that causes a computer to execute a process includes detecting a duplicating part in an encoding target and a first plurality of words in an encoded output, by comparing a particular unit in the encoding target and the first plurality of words that are encoded in the encoded output, the particular unit including a second plurality of words, when encoding the encoding target from an input text; encoding the duplicating part in the encoding target to an first dynamic code by a dynamic encoding; and replacing a first encoded part including the duplicating part in the encoded output to the first dynamic code.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 12 illustrates an exemplary data structure of decoding nodeless-tree information;

DESCRIPTION OF EMBODIMENT

Preferred embodiments of the present invention will be explained with reference to accompanying drawings. The embodiment does not intend to limit the invention.

Figure 1:
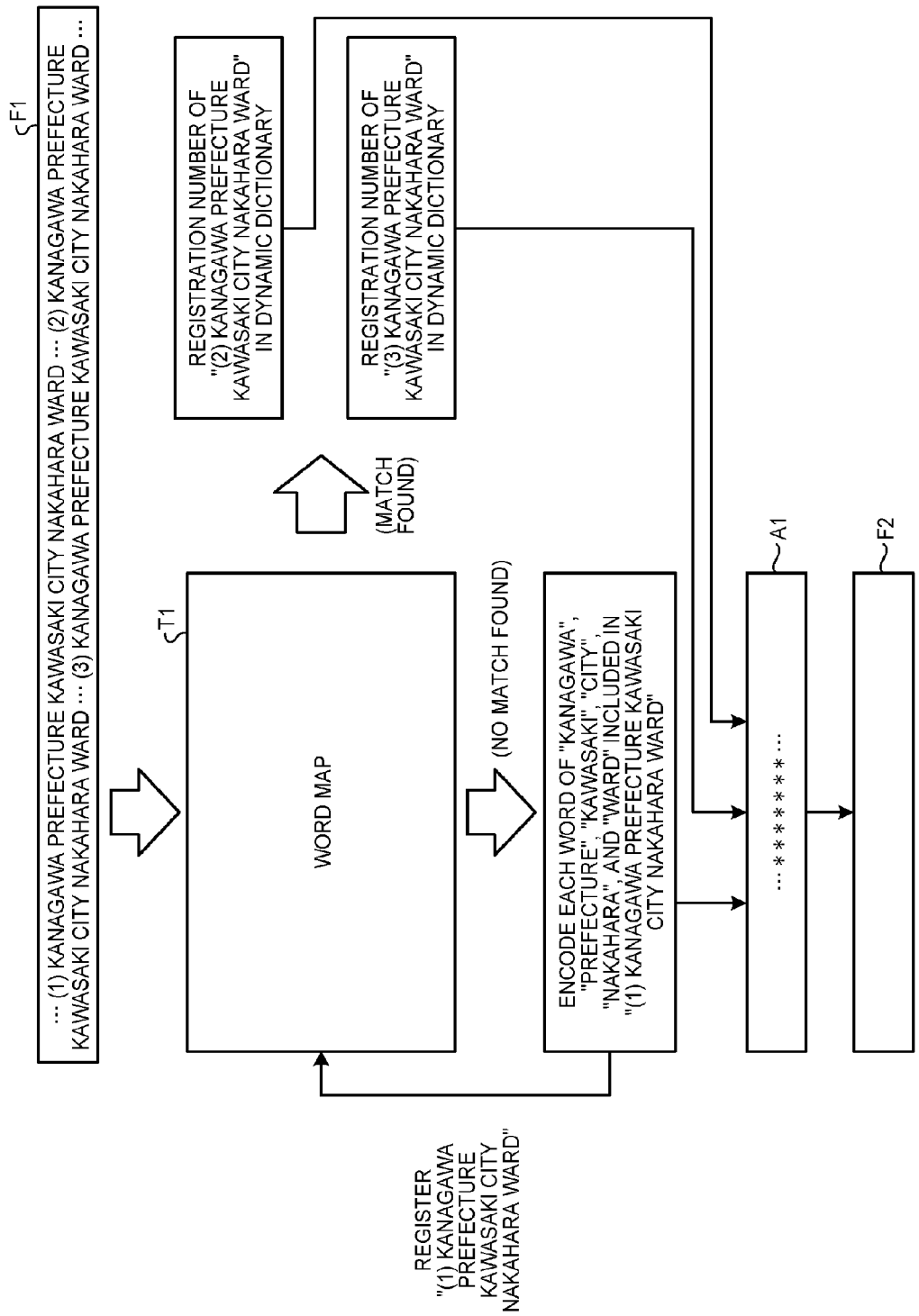
FIG. 1 illustrates an exemplary process of encoding processing by an information processing device according to the present embodiment.

FIG. 1 illustrates an exemplary process of encoding processing by an information processing device according to the present embodiment. The information processing device is an exemplary encoding device. The information processing device reads an encoding target file F1 and extracts a string (words) separated word by word, starting with the first character of the file F1. For example, the file F1 includes " . . . (1) Kanagawa Prefecture Kawasaki City Nakahara Ward . . . , (2) Kanagawa Prefecture Kawasaki City Nakahara Ward . . . , (3) Kanagawa Prefecture Kawasaki City Nakahara Ward . . . ". The indices "(1)" to "(3)" in the file F1 are applied for convenience to distinguish the respective strings of "Kanagawa Prefecture Kawasaki City Nakahara Ward", and the file F1 doesn't include the indices in reality. The dots " . . . " in the file F1 correspond to any unspecified string.

The information processing device reads the string of "(1) Kanagawa Prefecture Kawasaki City Nakahara Ward" word by word, and compares the words to a word map T1 to determine whether the string of "(1) Kanagawa Prefecture Kawasaki City Nakahara Ward" is a part including the same repetition as that in any previously encoded string. The word map T1 stores therein information on the previously encoded string. When the string of "(1) Kanagawa Prefecture Kawasaki City Nakahara Ward" is read for the first time, there is no part including the same repetition as that in the previously encoded string, and thus the information processing device encodes the string of "(1) Kanagawa Prefecture Kawasaki City Nakahara Ward" word by word.

For example, the information processing device encodes each word of "Kanagawa", "Prefecture", "Kawasaki", "City", "Nakahara", and "Ward", and writes encoded data into a storage region A1. The information processing device encodes the words using a static dictionary or a dynamic dictionary.

The static dictionary is information that associates a predetermined word having a high occurrence frequency with encoded data of this word having a high occurrence frequency. The dynamic dictionary is information that dynamically associates a word having a low occurrence frequency and not existing in the static dictionary with encoded data of the word. For example, the word not existing in the static dictionary is registered in the dynamic dictionary in association with a unique registration number, and this registration number is encoded data of the corresponding low-frequency word. The information processing device registers, in the word map T1, information that the string of "(1) Kanagawa Prefecture Kawasaki City Nakahara Ward" has been encoded word by word.

Subsequently, the information processing device reads the string of "(2) Kanagawa Prefecture Kawasaki City Nakahara Ward" word by word, and compares the words to the word map T1 to determine whether the string of "(2) Kanagawa Prefecture Kawasaki City Nakahara Ward" is a part including the same repetition as that in any previously encoded string. As described above, because the string of "(1) Kanagawa Prefecture Kawasaki City Nakahara Ward" has been encoded, the word map T1 registers information that the string of "(2) Kanagawa Prefecture Kawasaki City Nakahara Ward" has been already encoded. Thus, the information processing device determines that the string of "(2) Kanagawa Prefecture Kawasaki City Nakahara Ward" is a duplicating part identical to the previously encoded string.

In this case, the information processing device registers the string of "(2) Kanagawa Prefecture Kawasaki City Nakahara Ward" as a whole in the dynamic dictionary, and encodes the string of "(2) Kanagawa Prefecture Kawasaki City Nakahara Ward" by replacing the string with a registration number in the dynamic dictionary. For example, when the registration number of the string of "(2) Kanagawa Prefecture Kawasaki City Nakahara Ward" registered in the dynamic dictionary is "A002h", encoded data of the string of "(2) Kanagawa Prefecture Kawasaki City Nakahara Ward" is "A002h". The information processing device writes the encoded data of the string of "(2) Kanagawa Prefecture Kawasaki City Nakahara Ward" to the storage region A1.

Subsequently, the information processing device reads the string of "(3) Kanagawa Prefecture Kawasaki City Nakahara Ward" word by word, and compares the words to the word map T1 to determine whether the string of "(3) Kanagawa Prefecture Kawasaki City Nakahara Ward" is a part including the same repetition as that in any previously encoded string. As described above, because the string of "(1) Kanagawa Prefecture Kawasaki City Nakahara Ward" has been encoded, the word map T1 registers information that the string of "(3) Kanagawa Prefecture Kawasaki City Nakahara Ward" has been already encoded. Thus, the information processing device determines that the string of "(3) Kanagawa Prefecture Kawasaki City Nakahara Ward" is a duplicating part identical to the previously encoded string.

In this case, by referring to the dynamic dictionary, the information processing device encodes the string of "(3) Kanagawa Prefecture Kawasaki City Nakahara Ward" by replacing the string with a registration number in the dynamic dictionary. Since the string of "(3) Kanagawa Prefecture Kawasaki City Nakahara Ward", which is the same as the string of "(2) Kanagawa Prefecture Kawasaki City Nakahara Ward", has already been registered in the dynamic dictionary, encoded data of the string of "(3) Kanagawa Prefecture Kawasaki City Nakahara Ward" is the registration number "A002h" of the string of "(2) Kanagawa Prefecture Kawasaki City Nakahara Ward". The information processing device writes the encoded data of the string of "(3) Kanagawa Prefecture Kawasaki City Nakahara Ward" to the storage region A1.

The information processing device stores, in an encoded file F2, the encoded data stored in the storage region A1.

Figure 2:
FIG. 2 illustrates an exemplary block configuration of an encoded file F2.

FIG. 2 illustrates an exemplary block configuration of the encoded file F2. As illustrated in FIG. 2, the encoded file F2 includes a header, an encoded data, and a trailer. The header has, for example, information for identifying an algorithm used to generate the encoded file F2, and information such as a parameter used in encoding. The encoded data corresponds to encoded data generated by the information processing device. For example, the encoded data includes a plurality of files, and each file is set with a file ID for uniquely identifying the file. The trailer includes information on the dynamic dictionary after encoding.

Figure 3:
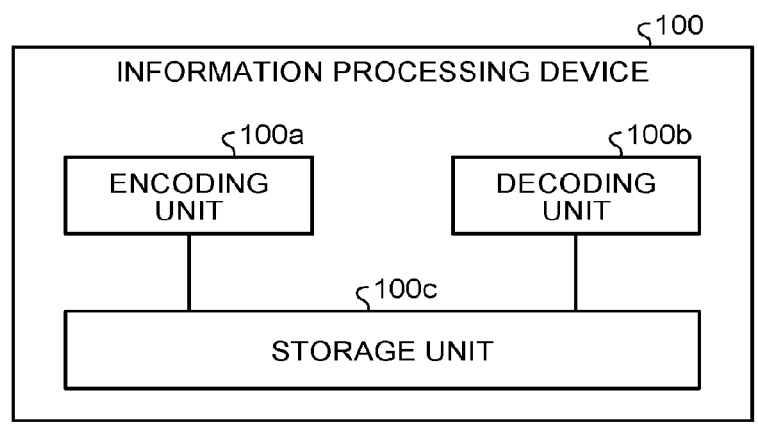
FIG. 3 is a functional block diagram of the configuration of the information processing device according to the present embodiment.

FIG. 3 is a functional block diagram of the configuration of the information processing device according to the present embodiment. As illustrated in FIG. 3, this information processing device 100 includes an encoding unit 100*a*, a decoding unit 100*b*, and a storage unit 100*c*.

The encoding unit 100*a* is a processor configured to execute the encoding processing illustrated in FIG. 1. The decoding unit 100*b* is a processor configured to decode data encoded by the encoding unit 100*a*. The storage unit 100*c* stores therein the encoding target file F1, the encoded file F2 obtained by the encoding processing, and a decoded file F3 obtained by decoding the encoded file F2, for example.

Figure 4:
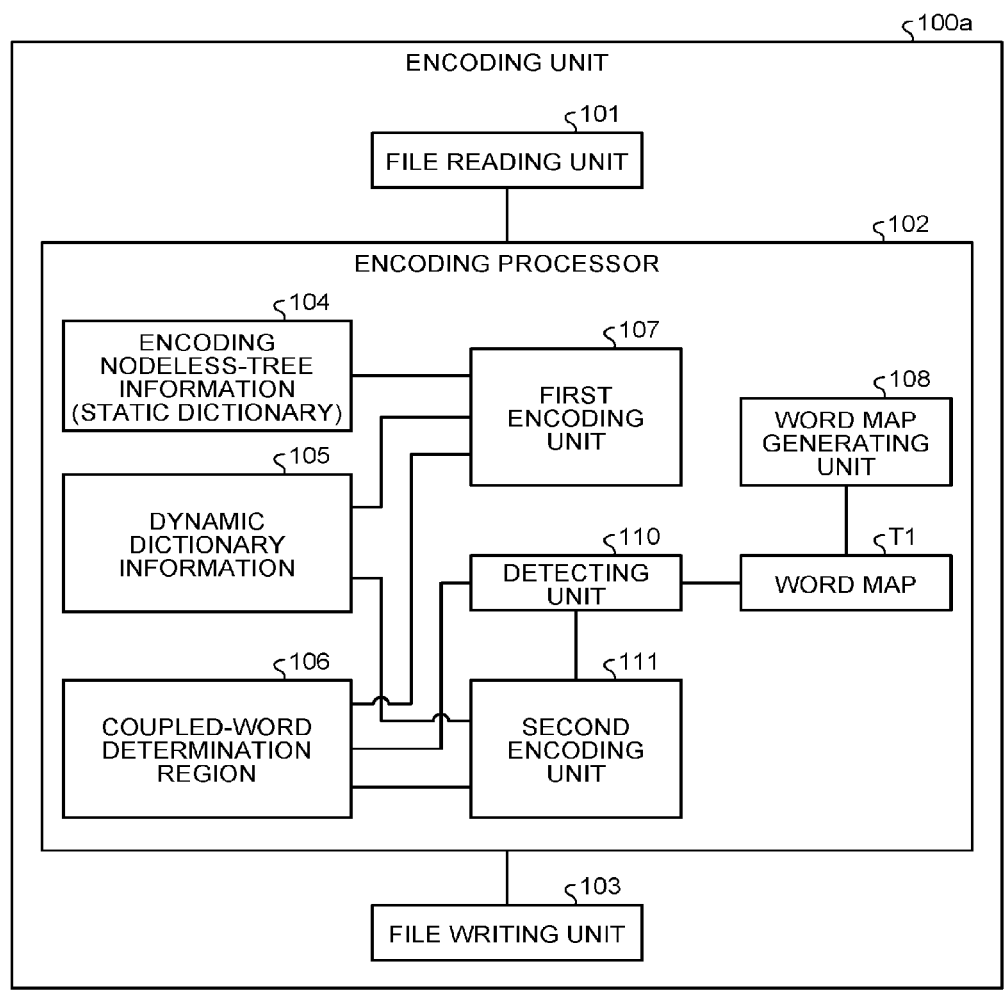
FIG. 4 is a functional block diagram of an exemplary configuration of an encoding unit according to the present embodiment.

FIG. 4 is a functional block diagram of an exemplary configuration of the encoding unit according to the present embodiment. As illustrated in FIG. 4, the encoding unit 100*a* includes a file reading unit 101, an encoding processor 102, and a file writing unit 103.

The file reading unit 101 is a processor configured to read data of a content part of the encoding target file F1. The file reading unit 101 scans strings included in the read data from the top, and sequentially extracts the strings word by word to output the extracted words to the encoding processor 102.

For example, when the content part of the file F1 includes the string of "Kanagawa Prefecture Kawasaki City Nakahara Ward", the file reading unit 101 outputs, to the encoding processor 102, each word of "Kanagawa", "Prefecture", "Kawasaki", "City", "Nakahara", and "Ward" in this order.

The encoding processor 102 is a processor configured to encode, if words included in the encoded file F2 include a duplicating part identical to a set of words as encoding targets, this set of words as a whole by allocating a dynamic code to the set of words of this duplicating part. If the words included in the encoded file F2 include no duplicating part identical to the set of words as encoding targets, the encoding processor 102 encodes each encoding target word. The encoding processor 102 outputs encoded data as an encoding result to the file writing unit 103.

The file writing unit 103 is a processor configured to acquire the encoded data from the encoding processor 102 and write the acquired encoded data to the encoded file F2. The file writing unit 103 stores, in the trailer of the encoded file F2, a dynamic dictionary information 105 generated by the encoding processor 102 to be described later.

The encoding processor 102 includes encoding nodeless-tree information 104, the dynamic dictionary information 105, a coupled-word determination region 106, a first encoding unit 107, a word map generating unit 108, the word map T1, a detecting unit 110, and a second encoding unit 111.

Figure 5:
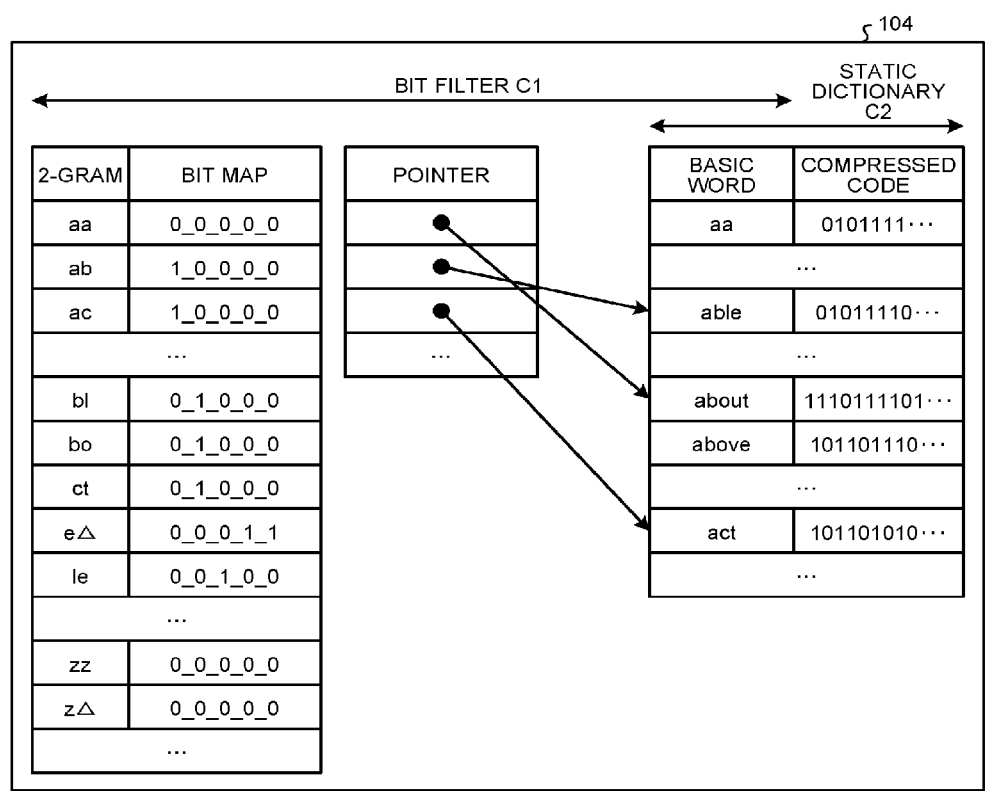
FIG. 5 illustrates an exemplary data structure of encoding nodeless-tree information.

FIG. 5 illustrates an exemplary data structure of the encoding nodeless-tree information. The encoding nodeless-tree information 104 includes information on a static dictionary used to encode a high-frequency word. As illustrated in FIG. 5, this encoding nodeless-tree information 104 includes a 2-gram, a bit map, a pointer, a basic word, and a compressed code. Among these, the 2-gram, the bit map, the pointer, and the basic word correspond to a bit filter C1. The basic word and the compressed code correspond to the static dictionary C2.

The 2-gram is information representing a string (word) of two characters. The bit map corresponds to a 2-gram string. For example, the bit map corresponding to "aa" is "0_0_0_0_0". The pointer indicates the position of a basic word corresponding to the bit map.

The basic word is a high frequency word registered in the static dictionary C2. The compressed code is encoded data allocated to the basic word. The static dictionary C2 may include information such as a string length and an occurrence frequency in addition to the basic word and the compressed code. The first four bits of the compressed code are arranged as a bit sequence to enable identification that the encoded data (compressed code) is encoded based on the static dictionary C2. In other words, if the first four bits of the encoded data is a bit sequence in a predetermined range, the bit sequence indicates that the encoded data is encoded based on the static dictionary C2.

Figure 6:
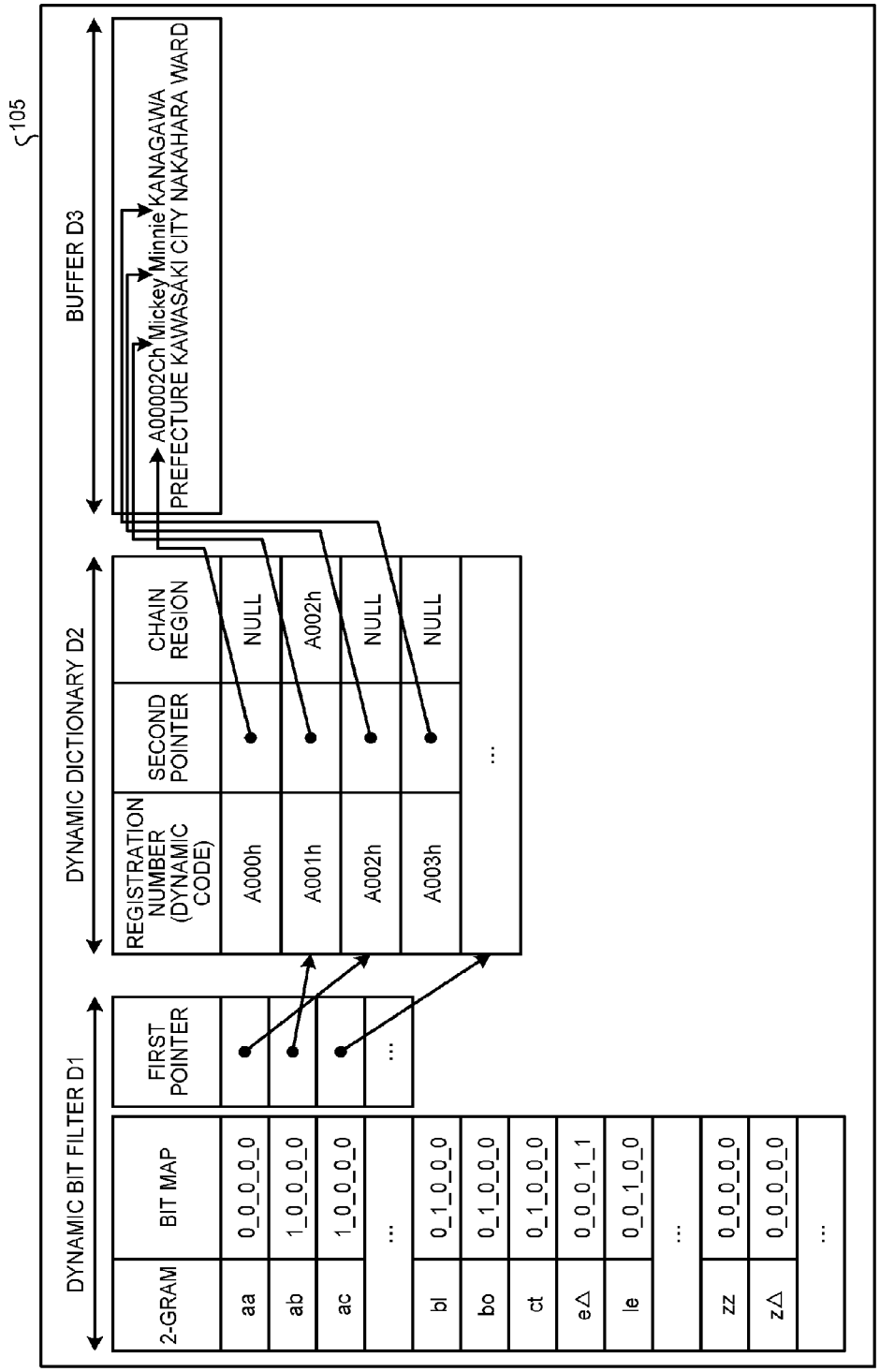
FIG. 6 illustrates an exemplary data structure of dynamic dictionary information.

FIG. 6 illustrates an exemplary data structure of the dynamic dictionary information. The dynamic dictionary information 105 includes information on the dynamic dictionary described above. As illustrated in FIG. 6, this dynamic dictionary information 105 includes a dynamic bit filter D1, a dynamic dictionary D2, and a buffer D3. The dynamic bit filter D1 includes a 2-gram, a bit map, and a first pointer. The dynamic dictionary D2 associates a registration number, a second pointer, and a chain region. The buffer D3 stores therein a low-frequency word (string) yet to be encoded by dynamic encoding.

The 2-gram of the dynamic bit filter D1 is information representing a string (word) of two characters. The bit map corresponds to a 2-gram string. For example, the bit map corresponding to "aa" is "0_0_0_0_0". The first pointer indicates the position of the registration number (dynamic code) corresponding to the bit map.

The registration number (dynamic code) of the dynamic dictionary D2 is a number allocated to a string or a plurality of words stored in the buffer D3. The second pointer is information indicating the position of the buffer D3 storing therein the string or the words corresponding to the registration number. For example, the second pointer corresponding to the registration number "A003h" indicates the start position of the string of "Kanagawa Prefecture Kawasaki City Nakahara Ward" stored in the buffer D3. In other words, the corresponding second pointer indicates that a plurality of words in the string of "Kanagawa Prefecture Kawasaki City Nakahara Ward" are dynamically encoded to "A003h" as a whole.

The chain region of the dynamic dictionary D2 is information indicating, depending on any duplication of pointers from the dynamic bit filter, whether matched strings are chained. For example, "A002h" is registered in the chain region for the registration number "A001h", and "Mickey" corresponding to the registration number "A001h" and "Minnie" corresponding to the registration number "A002h" have the first 2-gram of "Mi" in common and are made of six characters, which indicates that "Mickey" and "Minnie" are chained. When the matched strings are not chained, the chain region is set to be "NULL".

The coupled-word determination region 106 is used to determine whether words corresponding to the encoded file F2 include a duplicating part identical to words as encoding targets.

Figure 7:
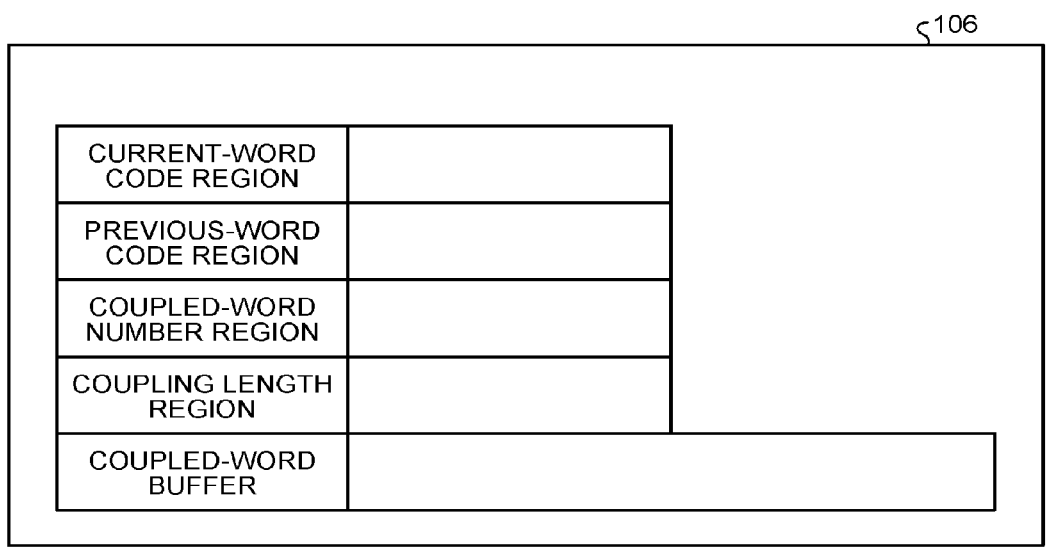
FIG. 7 illustrates an exemplary coupled-word determination region.

FIG. 7 illustrates an exemplary coupled-word determination region. As illustrated in FIG. 7, the coupled-word determination region 106 includes a current-word code region, a previous-word code region, a coupled-word number region, a coupling length region, and a coupled-word buffer. Description of each region will be made later.

The first encoding unit 107 acquires an encoding target word from the file reading unit 101, and compares the word to the bit filter C1 of the encoding nodeless-tree information 104 to determine whether the word is a high-frequency word or a low-frequency word. Then, the first encoding unit 107 encodes the word using the dynamic dictionary or the static dictionary based on a result of the determination, and outputs the encoded word to the file writing unit 103. The first encoding unit 107 also outputs the encoding target word to the coupled-word determination region 106.

For example, the first encoding unit 107 determines that the word is a high-frequency word if the word hits the bit filter C1, and encodes the word using the static dictionary. The first encoding unit 107 determines that the word is a low-frequency word if the word does not hit the bit filter C1, and encodes the word using the dynamic dictionary.

The following describes exemplary processing by the first encoding unit 107 to determine whether the word hits the bit filter C1. For example, if the word is "talk", the first encoding unit 107 combines the bit maps corresponding to "ta", "al", and "lk". If all bit maps have a value of 0 at a digit, the first encoding unit 107 sets "0" in the corresponding digit of the combined bit map. If at least one bit map includes a value of "1", the first encoding unit 107 sets "1" in the corresponding digit and combines the bit maps.

For example, the bit map of "ta" is "0_0_0_0_0", the bit map of "al" is "0_1_0_0_0", and the bit map of "lk" is "0_0_1_0_0". In this case, the bit maps are combined to have a bit map of "0_1_1_0_0".

The first encoding unit 107 compares the combined bit map and the pointer of the bit filter C1 to specify a basic word at a position indicated by the pointer corresponding to the bit map. The first encoding unit 107 searches for the basic word corresponding to the word, starting with the specified basic word. The first encoding unit 107 determines that the word hits the bit filter C1 if the basic word corresponding to the word exists. The first encoding unit 107 determines that the word does not hit the bit filter C1 if no basic word corresponding to the word exists.

The following describes exemplary processing by the first encoding unit 107 when a word is determined to be a high-frequency word. The first encoding unit 107 specifies the compressed code of the basic word corresponding to a word set in the static dictionary C2, and encodes the word by replacing the word with the specified compressed code.

The following describes exemplary processing by the first encoding unit 107 when a word is determined to be a low-frequency word. The first encoding unit 107 first determines whether the low-frequency word has already been registered in the dynamic dictionary D2. The first encoding unit 107 determines that the low-frequency word has already been registered in the dynamic dictionary D2 if the word hits the dynamic bit filter D1. The first encoding unit 107 determines that the low-frequency word is not registered in the dynamic dictionary D2 if the word does not hit the dynamic bit filter D1.

The following describes exemplary processing by the first encoding unit 107 to determine whether a word hits the dynamic bit filter D1. For example, when the word is "Minnie", the first encoding unit 107 combines the bit maps corresponding to "Mi", "in", "nn", "ni", and "ie". The same processing described for the bit filter C1 applies to this combination of the bit maps.

The first encoding unit 107 compares the combined bit map to the first pointer of the dynamic bit filter D1 to specify a record in the dynamic dictionary D2 at a position indicated by the first pointer corresponding to the bit map. Then, the first encoding unit 107 determines that a low-frequency word has already been registered in the dynamic dictionary D2 if the low-frequency word matches a string in the buffer D3 indicated by the second pointer of the specified record. In other words, the first encoding unit 107 determines that the word hits the dynamic bit filter D1. In this case, the first encoding unit 107 encodes the low-frequency word by replacing the low-frequency word with a specified registration number.

The first encoding unit 107 determines that the low-frequency word is not registered in the dynamic dictionary D2 if the low-frequency word does not match the string of the buffer D3 indicated by the specified second pointer. In other words, the first encoding unit 107 determines that the word does not hit the dynamic bit filter D1. In this case, the first encoding unit 107 adds, to the dynamic dictionary D2, information associating a unique registration number, the second pointer, and the chain region of "NULL". The first encoding unit 107 also registers the low-frequency word to a position in the buffer D3 indicated by the second pointer. Then, the first encoding unit 107 encodes the low-frequency word by replacing the low-frequency word with a new registration number.

The word map generating unit 108 is a processor configured to generate the word map T1 associating a word encoded by the first encoding unit 107 with a file ID. For example, the file ID is information for identifying each file included in the encoded file F2.

Figure 8:
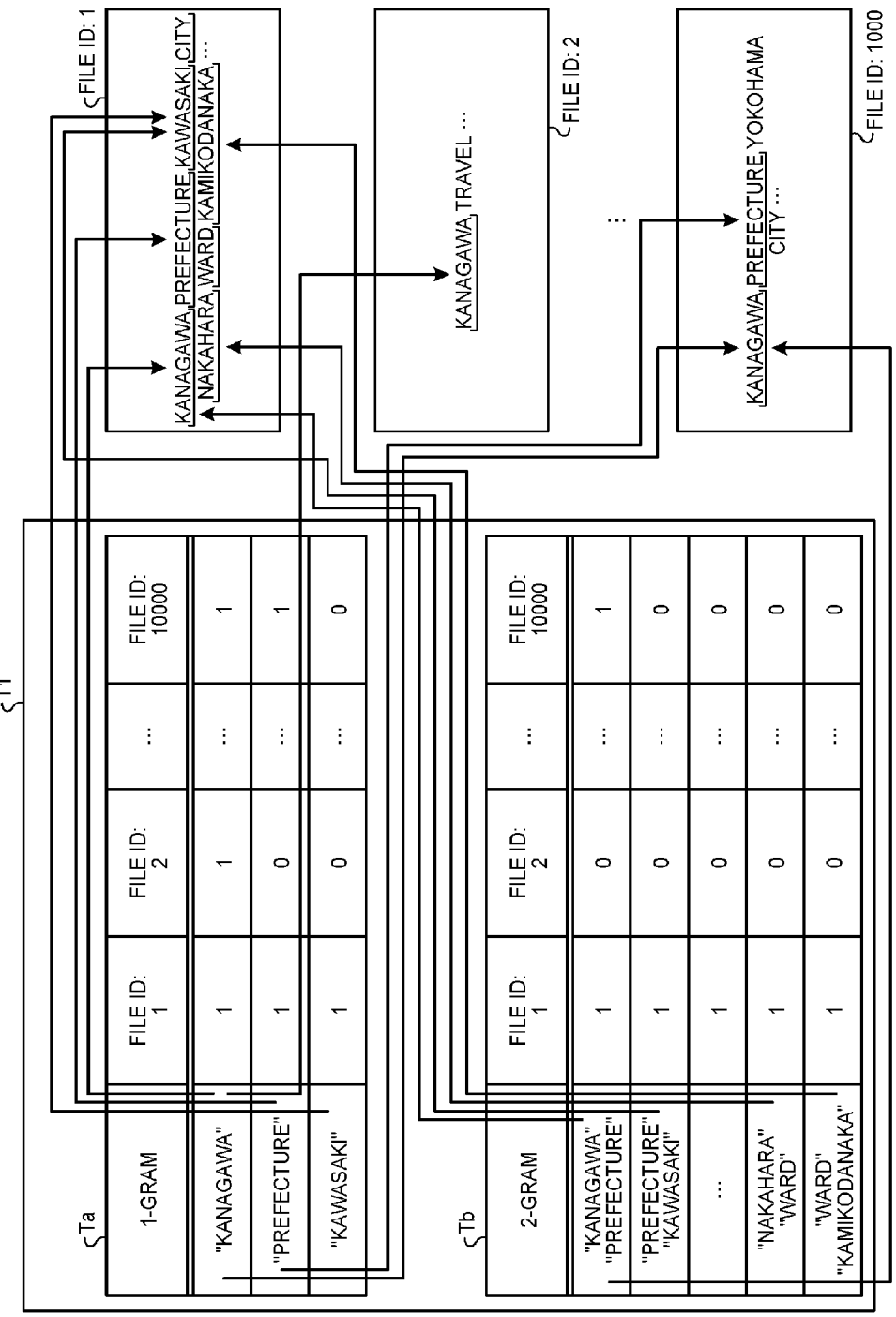
FIG. 8 illustrates an exemplary data structure of a word map.

FIG. 8 illustrates an exemplary data structure of the word map. As illustrated in FIG. 8, the word map T1 includes a 1-gram table Ta and a 2-gram table Tb. The 1-gram table Ta includes a 1-gram word and indicates, with "0" and "1", whether the 1-gram word exists in the target files. The value "0" indicates that a 1-gram word does not exist in the corresponding file, and the value "1" indicates that a 1-gram word exists in the corresponding file.

For example, the value "1" is set to a region in the 1-gram table Ta corresponding to the 1-gram word of "Kanagawa" and the file ID of "1", which indicates the 1-gram word of "Kanagawa" is included in the file with the file ID of "1". The value "0" is set to a region in the 1-gram table Ta corresponding to the 1-gram word of "Prefecture" and the file ID of "2", thereby indicating that the 1-gram word of "Prefecture" is not included a file with the file ID of "2".

The 2-gram table Tb includes a 2-gram word and indicates, with "0" and "1", whether the 2-gram word exists in the target files. The value "0" indicates that a 2-gram word does not exist in the corresponding file, and the value "1" indicates that a 2-gram word exists in the corresponding file.

For example, the value "1" is set to a region in the 2-gram table Tb corresponding to the 2-gram word of "Kanagawa" with "Prefecture" and the file ID of "1", which indicates that the 2-gram word of "Kanagawa" with "Prefecture" is included in the file with the file ID of "1". The value "0" is set to a region in the 2-gram table Tb corresponding to the 2-gram word of "Kanagawa" with "Prefecture" and the file ID of "2", thereby indicating that the 2-gram word of "Kanagawa" with "Prefecture" is not included in a file with the file ID of "2".

The word map generating unit 108 acquires information on a word encoded by the first encoding unit 107, and information on the file ID of a file to which the encoded word is output, and generates the word map T1 based on the acquired information. Each region in the 1-gram table Ta and the 2-gram table Tb has an initial value of "0". The word map generating unit 108 sets "1" in the 1-gram table Ta and the 2-gram table Tb based on a 1-gram or 2-gram word and the file ID of a file to which the word is output.

The detecting unit 110 is a processor configured to detecting a duplicating part in an encoding target and a first plurality of words in an encoded output, by comparing a particular unit in the encoding target and the first plurality of words that are encoded in the encoded output, the particular unit including a second plurality of words, when encoding the encoding target from an input text. For example the detecting unit 110 is a processor configured to compare a particular unit including a plurality of words to the previously encoded words so as to detect any part including the same repetition as that in the particular unit including the words. More specifically, the detecting unit 110 determines whether a set of a plurality of words to be encoded match a set of a plurality of previously encoded words based on the coupled-word determination region 106 and the word map T1.

Figure 9:
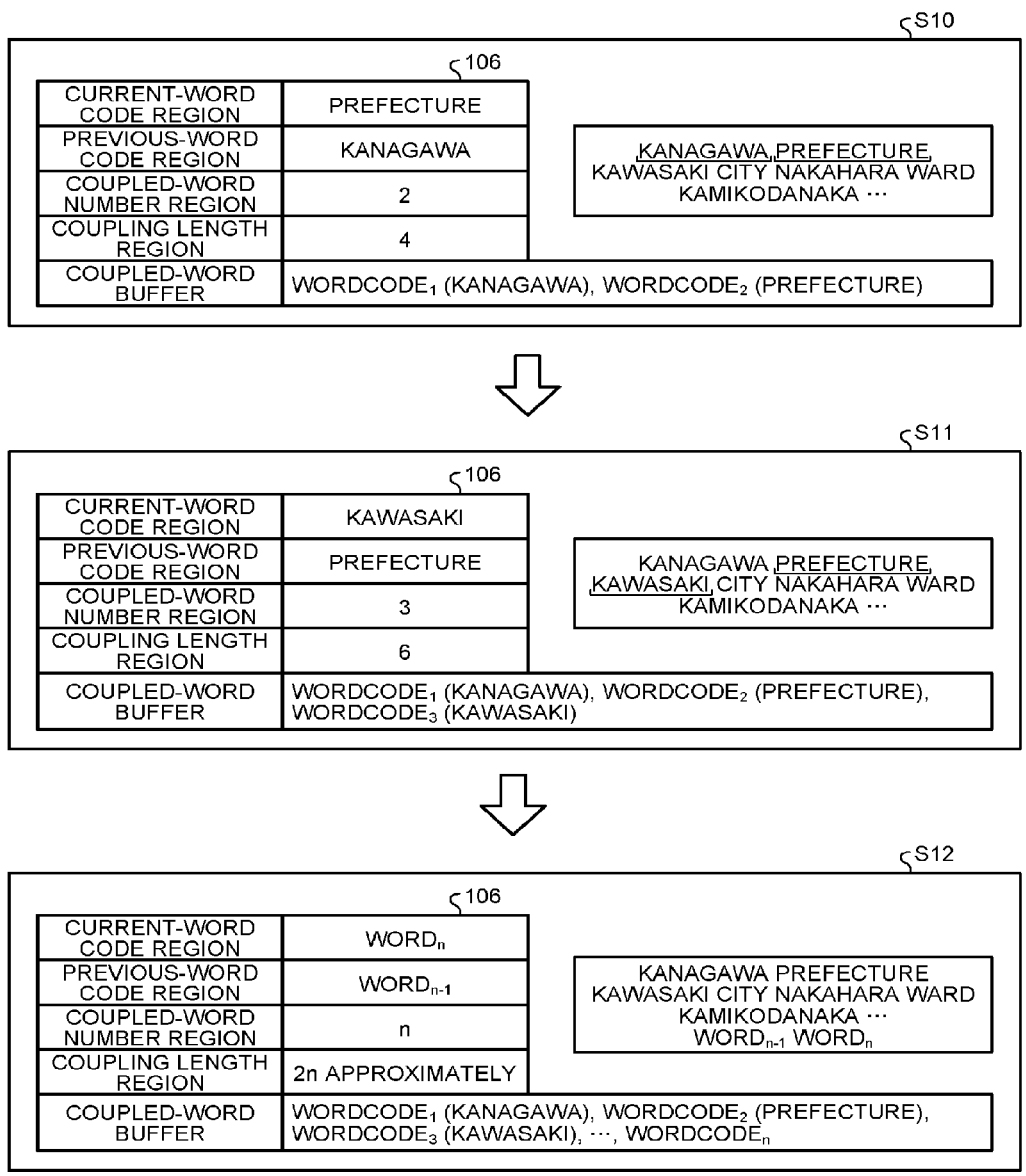
FIG. 9 illustrates processing by a detecting unit.

FIG. 9 illustrates processing by the detecting unit. As described with reference to FIG. 7, the coupled-word determination region 106 illustrated in FIG. 9 includes the current-word code region, the previous-word code region, the coupled-word number region, the coupling length region, and the coupled-word buffer. The current-word code region stores therein a word encoded by the first encoding unit 107. The previous-word code region stores therein a word that the first encoding unit 107 encoded right before the word stored in the current-word code region was encoded. The coupled-word number region stores therein the number of words stored in the coupled-word buffer. The coupling length region stores therein the combined length of the words stored in the coupled-word buffer. The coupled-word buffer stores therein a set of words that match a set of a plurality of previously encoded words. In the following description, the set of words stored in the coupled-word buffer are referred to as coupled words as appropriate.

Step S10 in FIG. 9 will be described. Assume that the first encoding unit 107 encodes the word of "Kanagawa" at the previous stage, and encodes the word of "Prefecture" at the current stage. In this case, the first encoding unit 107 sets "Prefecture" in the current-word code region, and sets "Kanagawa" in the previous-word code region.

The detecting unit 110 compares the pair of the word of "Kanagawa" stored in the previous-word code region and the word of "Prefecture" stored in the current-word code region, to the word map T1 so as to determine whether the pair of "Kanagawa" and "Prefecture" is previously encoded. Assume that information registered in the word map T1 is the information illustrated in FIG. 8. Then, since the 2-gram table Tb includes a region storing "1" as a record corresponding to the 2-gram word of "Kanagawa" with "Prefecture", the detecting unit 110 determines that the pair of "Kanagawa" and "Prefecture" is previously encoded.

The detecting unit 110 stores, in the coupled-word buffer, the pair of the words "Kanagawa" and "Prefecture" determined to be previously encoded. The detecting unit 110 sets "2" in the coupled-word number region and sets "4" in the coupling length region.

Step S11 in FIG. 9 will be described. Assume that the first encoding unit 107 encodes the word of "Prefecture" at the previous stage, and encodes the word of "Kawasaki" at the current stage. In this case, the first encoding unit 107 sets "Kawasaki" in the current-word code region, and sets "Prefecture" in the previous-word code region.

The detecting unit 110 compares the pair of the word of "Prefecture" stored in the previous-word code region and the word of "Kawasaki" stored in the current-word code region, to the word map T1 so as to determine whether the pair of "Prefecture" and "Kawasaki" is previously encoded. Assume that information registered in the word map T1 is the information illustrated in FIG. 8. Then, since the 2-gram table Tb includes a region storing "1" as a record corresponding to the 2-gram word of "Prefecture" with "Kawasaki", the detecting unit 110 determines that the pair of "Prefecture" and "Kawasaki" is previously encoded.

The detecting unit 110 stores, in the coupled-word buffer, the word of "Kawasaki" in the pair of the words "Prefecture" and "Kawasaki" determined to be previously encoded. Since the word of "Prefecture" is previously stored in the coupled-word buffer, the detecting unit 110 does not store the word of "Prefecture" in the coupled-word buffer. The detecting unit 110 sets "3" in the coupled-word number region and sets "6" in the coupling length region.

Step S12 in FIG. 9 will be described. Assume that the first encoding unit 107 encodes the word of "WORD$_{n-1}$" at the previous stage, and encodes the word of "WORD$_n$" at the current stage. In this case, the first encoding unit 107 sets "WORD$_n$" in the current-word code region and sets "WORD$_{n-1}$" in the previous-word code region.

The detecting unit 110 compares the pair of the word of "WORD$_{n-1}$" stored in the previous-word code region and the word of "WORD$_n$" stored in the current-word code region, to the word map T1 so as to determine whether the pair of "WORD$_{n-1}$" and "WORD$_n$" is previously encoded. The following description is made on an assumption that the pair of "WORD$_{n-1}$" and "WORD$_n$" is previously encoded.

The detecting unit 110 stores, in the coupled-word buffer, the word of "WORD$_n$" in the pair of the words "WORD$_{n-1}$" and "WORD$_n$" determined to be previously encoded. Assume that the word of "WORD$_{n-1}$" is previously stored in the coupled-word buffer. The detecting unit 110 sets "n" in the coupled-word number region and sets "2n approximately" in the coupling length region.

The detecting unit 110 repeatedly executes the above-described processing until any pair of a word stored in the previous-word code region and a word stored in the current-word code region are determined not to be previously encoded. The detecting unit 110 notifies the second encoding unit 111 of coupled words stored in the coupled-word buffer.

A particular unit including a plurality of words is compared with previously encoded words, so that a part including the same repetition as that in the particular unit including the words corresponds to the coupled words.

The second encoding unit 111 is a processor configured to perform dynamic encoding on the part (coupled words) including the same repetition as that in the particular unit including the words when the detecting unit 110 detects the part. For example, the second encoding unit 111 registers the coupled words in the dynamic dictionary, and sets a registration number at the registration in the dynamic dictionary as encoded data of the coupled words. The second encoding unit 111 outputs the encoded coupled words to the file writing unit 103. The following describes processing by the second encoding unit 111.

Figure 10:
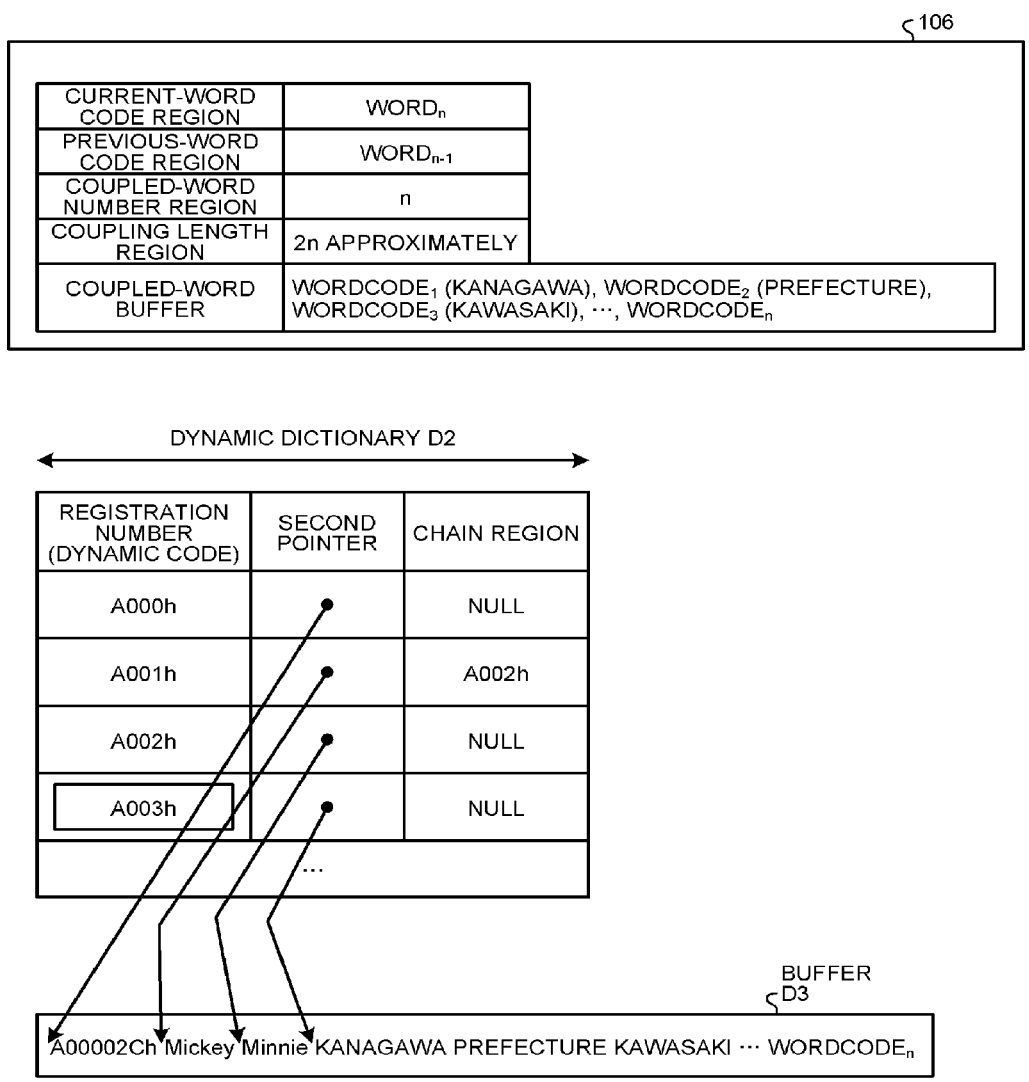
FIG. 10 illustrates exemplary processing by a second encoding unit.

FIG. 10 illustrates exemplary processing by the second encoding unit. As illustrated in FIG. 10, for example, the coupled-word buffer of the coupled-word determination region 106 stores therein "Kanagawa Prefecture Kawasaki, . . . , WORDCODE$_n$". The second encoding unit 111 registers a record with a uniquely allocated registration number in the dynamic dictionary D2, and stores the coupled words of "Kanagawa Prefecture Kawasaki . . . WORDCODE$_n$" in the buffer D3. For example, the second encoding unit 111 registers, in the dynamic dictionary D2, information associating the registration number "A003h", the second pointer indicating the position of the coupled words of "Kanagawa Prefecture Kawasaki . . . WORDCODE$_n$" in the buffer D3, and the chain region "NULL".

In addition, the second encoding unit 111 corrects the dynamic bit filter D1 based on the coupled words registered in the buffer D3. For example, in the case in which the coupled words of "Kanagawa Prefecture Kawasaki . . . WORDCODE$_n$" are registered in the buffer D3, the second encoding unit 111 performs the following processing. The second encoding unit 111 generates the first pointer corresponding to a bit map obtained by combining the bit map of the 2-gram word of "Kanagawa" with "Prefecture" and the bit map of the 2-gram word of "Prefecture" with "Kawasaki", and links the generated first pointer and the registration number "A003h" of the dynamic dictionary D2.

The second encoding unit 111 encodes the coupled words using the registration number of the dynamic dictionary D2. In the example illustrated in FIG. 10, the registration number corresponding to the coupled words of "Kanagawa Prefecture Kawasaki . . . WORDCODE$_n$" is "A003h". Accordingly, the second encoding unit 111 replaces the coupled words of "Kanagawa Prefecture Kawasaki . . . WORDCODE$_n$" with "A003h". The second encoding unit 111 outputs "A003h" obtained by the encoding to the file writing unit 103.

When the coupled words are already registered in the dynamic dictionary information 105, the second encoding unit 111 encodes the coupled words with the corresponding registration number. For example, the second encoding unit 111 compares the coupled words and the dynamic bit filter D1, and determines that the coupled words are registered in the dynamic dictionary information 105 if the coupled words hit the dynamic bit filter D1. If the coupled words do not hit the dynamic bit filter D1, the second encoding unit 111 determines that the coupled words are not registered in the dynamic dictionary information 105, registers the coupled words in the dynamic dictionary information 105, and encodes the coupled words with a registration number as described above.

The first encoding unit 107 described above skips the outputting of encoded data to the file writing unit 103 if an encoded word is included in the coupled words. For example, the first encoding unit 107 encodes each word of "Kanagawa", "Prefecture", "Kawasaki", . . . , and "WORDCODE$_n$", and if any encoded word is included in the coupled words, skips outputting of the encoded words of "Kanagawa", "Prefecture", "Kawasaki", . . . , and "WORDCODE$_n$" to the file writing unit 103. The words "Kanagawa", "Prefecture", "Kawasaki", . . . , and "WORDCODE$_n$" are collectively encoded and output to the file writing unit 103 by the second encoding unit 111. In contrast, the first encoding unit 107 outputs the encoded data to the file writing unit 103 if the encoded words are not included in the coupled words.

Figure 11:
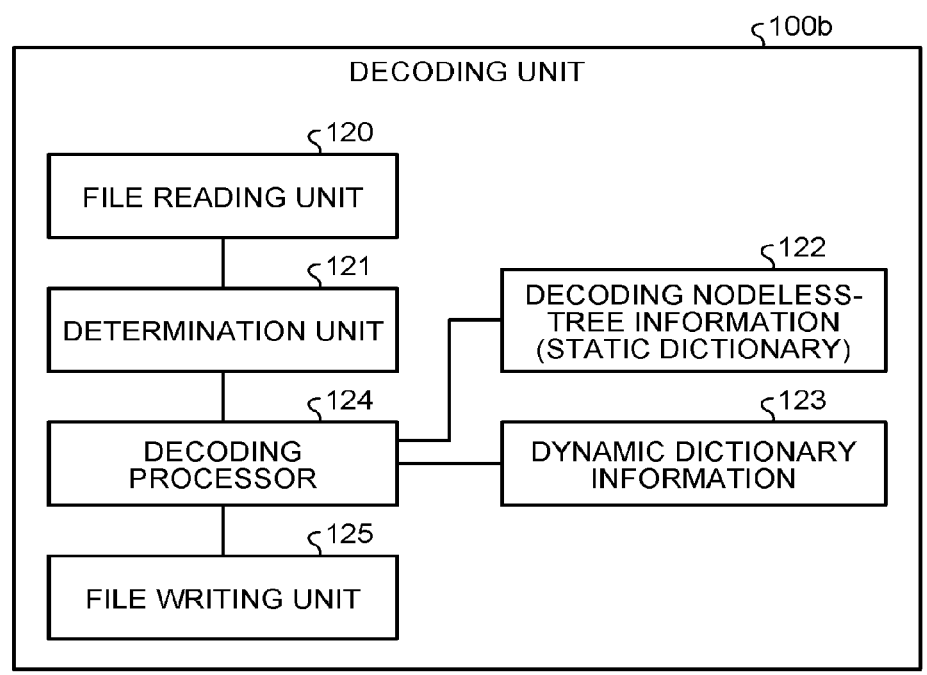
FIG. 11 is a functional block diagram of the configuration of a decoding unit according to the present embodiment.

The following describes the configuration of the decoding unit 100b illustrated in FIG. 3. FIG. 11 is a functional block diagram of the configuration of the decoding unit according to the present embodiment. As illustrated in FIG. 11, the decoding unit 100b includes a file reading unit 120, a determination unit 121, decoding nodeless-tree information 122, dynamic dictionary information 123, a decoding processor 124, and a file writing unit 125.

The file reading unit 120 is a processor configured to read encoded data of the encoded file F2 to a storage region B1 of the storage unit 100c. When processing on the encoded data stored in the storage region B1 is ended, the file reading unit 120 updates the encoded data stored in the storage region B1 by reading new encoded data from the encoded file F2.

The file reading unit 120 also reads the dynamic dictionary information 123 stored in the trailer of the encoded file F2. The dynamic dictionary information 123 corresponds to the dynamic dictionary information 105 illustrated in FIG. 4.

The determination unit 121 is a processor configured to read the encoded data stored in the storage region B1 and determine whether the encoded data is encoded data of a high-frequency word or a low-frequency word based on the first four bits of the encoded data. Assume that a value in a predetermined range is allocated to the first four bits of encoded data of a high-frequency word. The determination unit 121 outputs the encoded data and a result of the determination to the decoding processor 124.

The decoding nodeless-tree information 122 is used to decode data that was encoded based on the static dictionary.

FIG. 12 illustrates an exemplary data structure of the decoding nodeless-tree information. As illustrated in FIG. 12, the decoding nodeless-tree information 122 has a plurality of branches 60-1 to 60-$n$ and a plurality of leaves 61-1 to 61-$m$. Certain bit sequences are allocated to the branches 60-1 to 60-$n$. The structure denoted by 61 is a data structure of a leaf. For example, the leaf stores therein leaf identification information, a compressed code length, and a pointer to a character code or a basic word. The leaf identification information is information for uniquely identifying the leaf. The compressed code length is information indicating an effective length of the bit sequence of compressed data in comparison with the branches 60-1 to 60-$n$. The pointer to a character code or a basic word is information uniquely indicating decompressed data obtained by decompressing a compressed code.

The dynamic dictionary information 123 is stored in the trailer of the encoded file F2. The dynamic dictionary information 123 corresponds to the dynamic dictionary information 105 illustrated in FIG. 4.

The decoding processor 124 is configured to decode the encoded data in accordance with the decoding nodeless-tree information 122 based on a result of the determination by the determination unit 121 or decode the encoded data using the dynamic dictionary information 123.

The decoding processor 124 decodes the encoded data using the decoding nodeless-tree information 122 if the encoded data is encoded data of a high-frequency word. The decoding processor 124 decodes the encoded data using the dynamic dictionary information 123 if the encoded data is encoded data of a low-frequency word. The decoding processor 124 outputs the decoded data to the file writing unit 125.

The following describes exemplary processing by the decoding processor 124 to decode the encoded data of a high-frequency word. The decoding processor 124 compares a bit sequence of the encoded data and bit sequences allocated to the branches 60-1 to 60-$n$ of the decoding nodeless-tree information 122 so as to specify a leaf connected with a branch that hits the bit sequence of the encoded data. The leaf stores therein information on the string corresponding to compressed data.

For example, the bit sequence "010111110111101" of encoded data hits the branch 60-4, the compressed code length of the leaf 61-4 connected with the branch 60-4 is "11", and a basic word indicated by a pointer to basic word is "talk". In this case, a bit sequence "01011111011" as the first to the eleventh bits of the whole bit sequence is the encoded data corresponding to the basic word of "talk". The decoding processor 124 decodes the encoded data by replacing the first eleven bits of the bit sequence "010111110111101" of the encoded data with the basic word of "talk".

The following describes exemplary processing by the decoding processor 124 to decode encoded data of a low-frequency word. The decoding processor 124 compares the bit sequence of the encoded data and the registration number of the dynamic dictionary information 123 so as to determine a registration number that hits the bit sequence of the encoded data. The decoding processor 124 specifies the second pointer corresponding to the hit registration number, and acquires, for example, decoded coupled words by referring to a position in the buffer D3 indicated by the second pointer. The decoding processor 124 decodes the encoded data by replacing the encoded data with the acquired coupled words, for example.

The following expresses a bit sequence in hexadecimal for the purpose of description and describes processing by the decoding processor 124. For example, when encoded data is "A003h", a hit is made on the registration number "A003h" of the dynamic dictionary D2 in FIG. 10. The decoding processor 124 refers to the second pointer on a row on which the registration number "A003h" is placed, and refers to a position in the buffer D3 indicated by the second pointer. This indicates the position of the coupled words of "Kanagawa Prefecture Kawasaki . . . WORDCODE$_n$", so that the decoding processor 124 decodes "A003h" by replacing "A003h" with "Kanagawa Prefecture Kawasaki . . . WORDCODE$_n$".

The file writing unit 125 is a processor configured to acquire the decoded data from the decoding processor 124 and write the acquired decoded data to the decoded file F3 in a storage region B3.

The following describes processing procedures of the encoding unit 100a and the decoding unit 100b illustrated in FIGS. 9 and 10.

Figure 13:
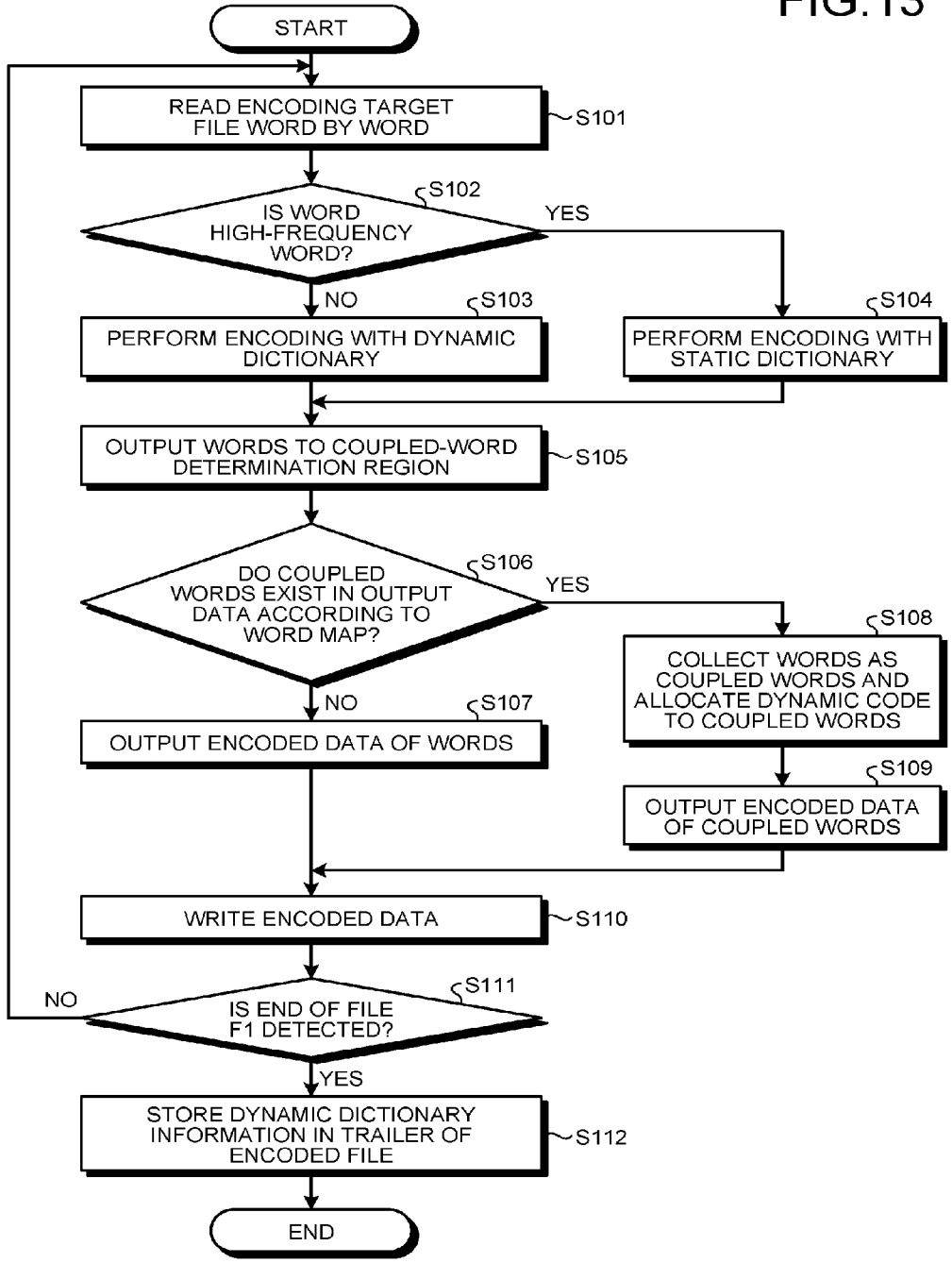
FIG. 13 is a flowchart of a processing procedure by the encoding unit according to the present embodiment.

FIG. 13 is a flowchart of the processing procedure of the encoding unit according to the present embodiment. As illustrated in FIG. 13, the file reading unit 101 of the encoding unit 100a reads the encoding target file F1 word by word (step S101). The first encoding unit 107 of the encoding unit 100a determines whether each read word is a high-frequency word (step S102).

If the read word is not a high-frequency word (No at step S102), the first encoding unit 107 performs encoding using the dynamic dictionary (step S103) and proceeds to step S105. At step S103, the first encoding unit 107 encodes the low-frequency word using the dynamic dictionary information 105.

If the read word is a high-frequency word (Yes at step S102), the first encoding unit 107 performs encoding using the static dictionary (step S104) and proceeds to step S105. At step S104, the first encoding unit 107 encodes the high-frequency word using the encoding nodeless-tree information 104.

The first encoding unit 107 outputs the read words to the coupled-word determination region 106 (step S105). The detecting unit 110 of the encoding unit 100a determines whether coupled words exist in the output data using the word map T1 (step S106).

If the detecting unit 110 determines that no coupled words exist (No at step S106), the first encoding unit 107 outputs encoded data of the read words to the file writing unit 103 (step S107) and proceeds to step S110.

If the detecting unit 110 determines that coupled words exist (Yes at step S106), the second encoding unit 111 collects the read words as coupled words and allocates a dynamic code to the coupled words (step S108). At step S108, the second encoding unit 111 registers, in the dynamic dictionary information 105, coupled words stored in the coupled-word buffer of the coupled-word determination region 106 and replaces the coupled words with a registration number.

The second encoding unit 111 outputs the encoded data of the coupled words to the file writing unit 103 (step S109). The file writing unit 103 writes the encoded data (step S110).

The encoding processor 102 proceeds to step S101 if the end of the file F1 is not yet detected (No at step S111). If the end of the file F1 is detected (Yes at step S111), the encoding processor 102 stores the dynamic dictionary information in the trailer of the encoded file F2 (step S112) and ends the processing.

Figure 14:
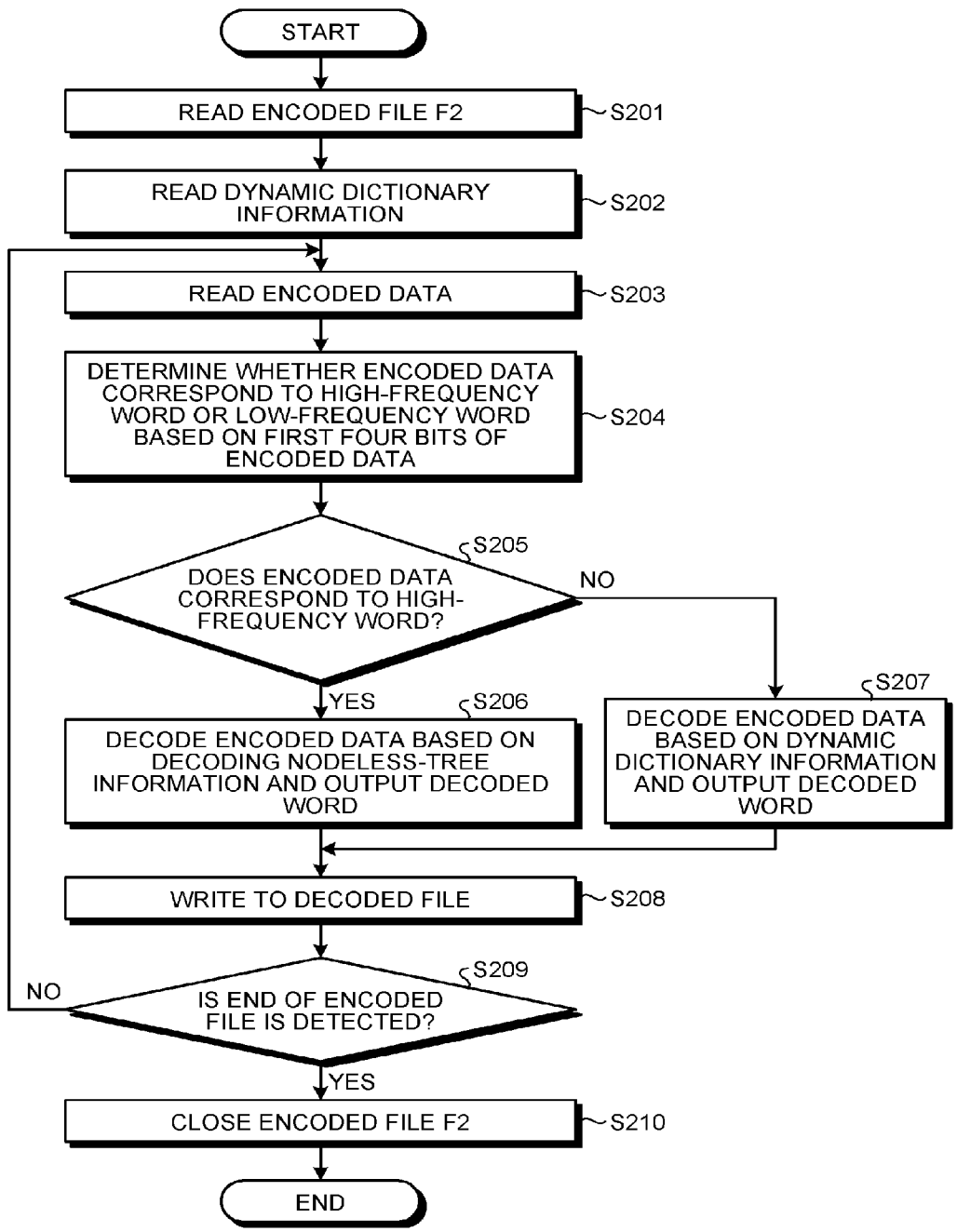
FIG. 14 is a flowchart of a processing procedure by the decoding unit according to the present embodiment.

FIG. 14 is a flowchart of a processing procedure of the decoding unit according to the present embodiment. As illustrated in FIG. 14, the file reading unit 120 of the decoding unit 100b reads the encoded file F2 (step S201) and reads the dynamic dictionary information (step S202).

The file reading unit 120 reads encoded data from the encoded file F2 (step S203). The determination unit 121 of the decoding unit 100b determines whether the encoded data corresponds to a high-frequency word or a low-frequency word based on the first four bits of the encoded data (step S204).

If the encoded data corresponds to a high-frequency word (Yes at step S205), the decoding processor 124 decodes the encoded data using the decoding nodeless-tree information 122. The decoding processor 124 outputs a decoded word to the file writing unit 125 (step S206) and proceeds to step S208.

If the encoded data is not a high-frequency word but is a low-frequency word (No at step S205), the decoding processor 124 decodes the encoded data based on the dynamic dictionary information 123. The decoding processor 124 outputs a decoded word to the file writing unit 125 (step S207) and proceeds to step S208.

The file writing unit 125 of the decoding unit 100b writes the word to a decoded file (step S208). The decoding unit 100b proceeds to step S203 if the end of the encoded file F2 is not yet detected (No at step S209).

If the end of the encoded file F2 is detected (Yes at step S209), the decoding unit 100b closes the encoded file F2 (step S210) and ends the processing.

The following describes an effect of the information processing device 100 according to the present embodiment. If words in a previously encoded file include coupled words as a duplicating part identical to words as encoding targets, the encoding unit 100a of the information processing device 100 performs processing to allocate a dynamic code to the coupled words. By performing this processing, the information processing device 100 can encode a string including a plurality of words as a whole even after words in this string have been individually encoded.

The detecting unit 110 of the encoding unit 100a registers detected coupled words and a registration number in association with each other in the dynamic dictionary information 105, and performs dynamic encoding to replace the coupled words with the registration number. Since a single dynamic code is allocated to coupled words including a plurality of words, compression ratio can be increased.

When a target document includes "Kanagawa Prefecture Kawasaki City Nakahara Ward Kamikodanaka" followed by "Kanagawa Prefecture Kawasaki City Nakahara Ward Shimokodanaka", the character "Kami" (character code: E4B88Ah) and the character "Shimo" (character code: E4B88Bh) include the first two bytes of "E4B8h" in common. In the conventional technology, the CJK characters are divided, and the byte sequence of the character code of "Kanagawa Prefecture Kawasaki City Nakahara Ward" coupled with "E4B8h" is set as a longest match string. Once the division of CJK characters occurs, it is impossible to set "Kanagawa Prefecture Kawasaki City Nakahara Ward" as the longest match string even when "Kanagawa Prefecture Kawasaki City Nakahara Ward Ida" follows, until the division is canceled. This results in a reduced efficiency of code allocation to the longest match string. The information processing device 100 according to the present embodiment, however, detects any duplicating part word by word so that the above-described division of CJK characters does not occur, and a dynamic code can be allocated to "Kanagawa Prefecture Kawasaki City Nakahara Ward" as a duplicating part (longest match string), thereby improving efficiency of code allocation.

Every time a word in the encoding target file F1 is encoded, the word map generating unit 108 of the encoding unit 100a generates the word map T1 associating a 2-gram word with the file ID of a file to which encoded data is output. By using the word map T1, the detecting unit 110 can promptly determine whether each encoding target word is previously encoded.

The decoding unit 100b decodes encoded data using the dynamic dictionary information 123, and thus can decode, all at once, encoded data obtained by the encoding unit 100a encoding a plurality of words as a whole.

Figure 15:
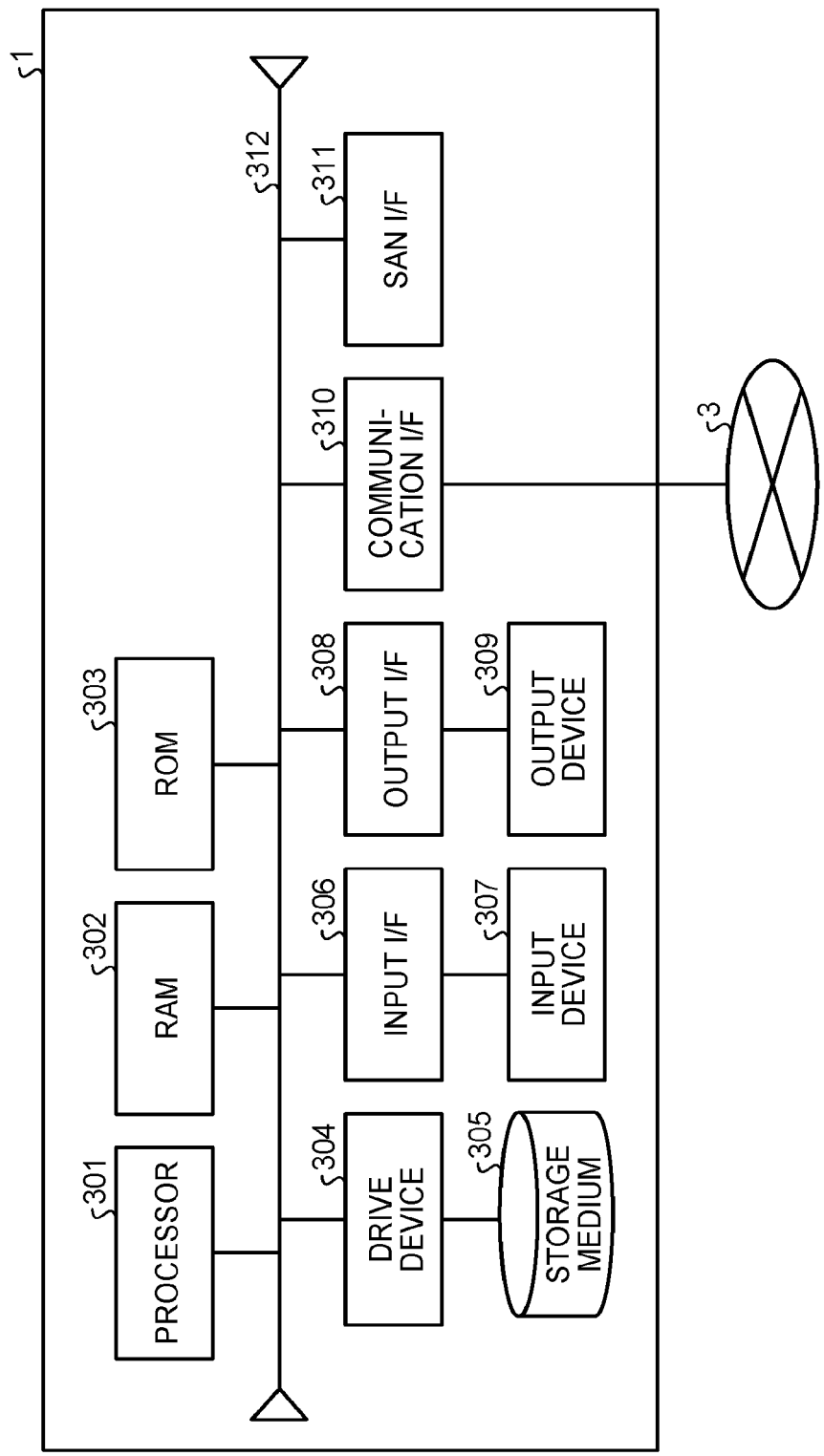
FIG. 15 illustrates a hardware exemplary configuration of a computer.

The following describes hardware and software used in the present embodiment. FIG. 15 illustrates a hardware exemplary configuration of a computer. This computer 1 includes a processor 301, a random access memory (RAM) 302, a read only memory (ROM) 303, a drive device 304, a storage medium 305, an input interface (I/F) 306, an input device 307, an output interface (I/F) 308, an output device 309, a communication interface (I/F) 310, a storage area network (SAN) interface (I/F) 311, and a bus 312. These pieces of hardware are connected with each other through the bus 312.

The RAM 302 is a readable and writable memory device, and is, for example, a semiconductor memory such as a static RAM (SRAM), a dynamic RAM (DRAM), and a flash memory that is not a RAM. The ROM 303 may be a programmable ROM (PROM), for example. The drive device 304 is configured to perform at least one of reading and writing of information stored in the storage medium 305. The storage medium 305 stores therein information written by the drive device 304. The storage medium 305 is, for example, a hard disk, a flash memory such as a solid state drive (SSD), a compact disc (CD), a Digital Versatile Disc (DVD), or a Blu-ray Disc. For example, the computer 1 includes the drive device 304 and the storage medium 305 for each of a plurality of kinds of storage media.

The input interface 306 is a circuit connected with the input device 307 and configured to transfer an input signal received from the input device 307 to the processor 301. The output interface 308 is a circuit connected with the output device 309 and configured to cause the output device 309 to output in accordance with an instruction from the processor 301. The communication interface 310 is a circuit configured to control communication that is established over a network 3. The communication interface 310 is a network interface card (NIC), for example. The SAN interface 311 is a circuit configured to control communication with a storage device connected with the computer 1 through a storage area network. The SAN interface 311 is a host bus adapter (HBA), for example.

The input device 307 is configured to transmit an input signal in response to an operation. Examples of the input signal include key devices such as a keyboard and a button attached to a body of the computer 1, and pointing devices such as a mouse and a touch panel. The output device 309 is configured to output information under control of the computer 1. Examples of the output device 309 include an image output device (display device) such as a display, and a sound output device such as speaker. In addition, an input and output device such as a touch screen may be used as the input device 307 and the output device 309. The input device 307 and the output device 309 may be integrated with the computer 1, or may be not included in the computer 1 but externally connected with the computer 1, for example.

For example, the processor 301 loads a computer program stored in the ROM 303 or the storage medium 305 onto the RAM 302, and performs the processing of the encoding unit 100a or the processing of the decoding unit 100b in accordance with the procedure of the loaded program. In this processing, the RAM 302 is used as a work area of the processor 301. The functionality of the storage unit 100c includes: storing program files (an application program 24, a middleware 23, and an operating system (OS) 22 to be described later, for example) and data files (the file F1 as a compression target, and the compressed file F2, for example) in the ROM 303 and the storage medium 305; and causing the RAM 302 to be available as the work area of the processor 301. The following describes the program loaded by the processor 301 with reference to FIG. 16.

Figure 16:
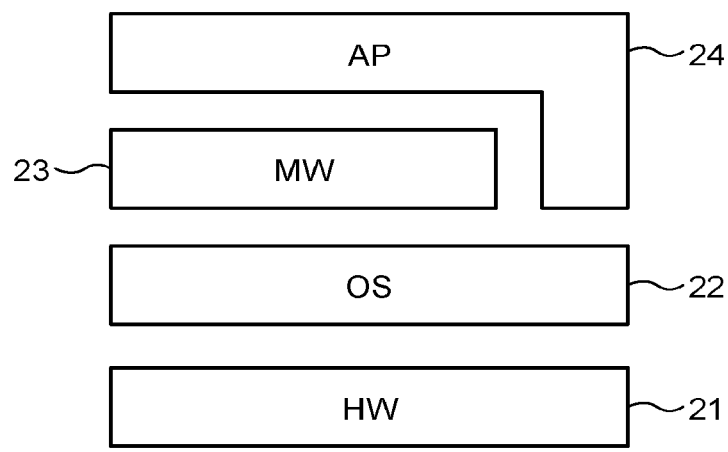
FIG. 16 illustrates an exemplary configuration of computer programs operated by the computer.

FIG. 16 illustrates an exemplary configuration of computer programs operated by the computer. In the computer 1, the OS 22 configured to control a hardware group 21 (301 to 312) illustrated in FIG. 15 operates. The processor 301 operates a procedure under the OS 22 so as to control and manage the hardware group 21, whereby the process following the application program 24 and the middleware 23 is executed by the hardware group 21. In addition, in the computer 1, the middleware 23 and the application program 24 are loaded onto the RAM 302 and executed by the processor 301.

When a compression function is called, the processor 301 performs processing in accordance with at least part of the middleware 23 or the application program (the processing controlling the hardware group 21 under the OS 22), thereby providing the functionality of the encoding unit 100a. When a decoding function is called, the processor 301 performs processing in accordance with at least part of the middleware 23 or the application program (the processing controlling the hardware group 21 under the OS 22), thereby providing the functionality of the decoding unit 100b. The compression function and the decoding function may be included in the application program 24, or may be part of the middleware 23 executed when called from the application program 24.

The encoded file F2 obtained by the compression function of the application program 24 (or the middleware 23) can be partially decoded based on the dynamic dictionary information in the encoded file F2, for example. When an expansion is performed in the middle of the encoded file F2, the processing amount of decoding of encoded data is reduced by an amount corresponding to a part excluding a decoding target part, and thus a load on the processor 301 is reduced. In addition, since the compressed data as the decoding target is partially loaded onto the RAM 302, the work area is also reduced.

Figure 17:
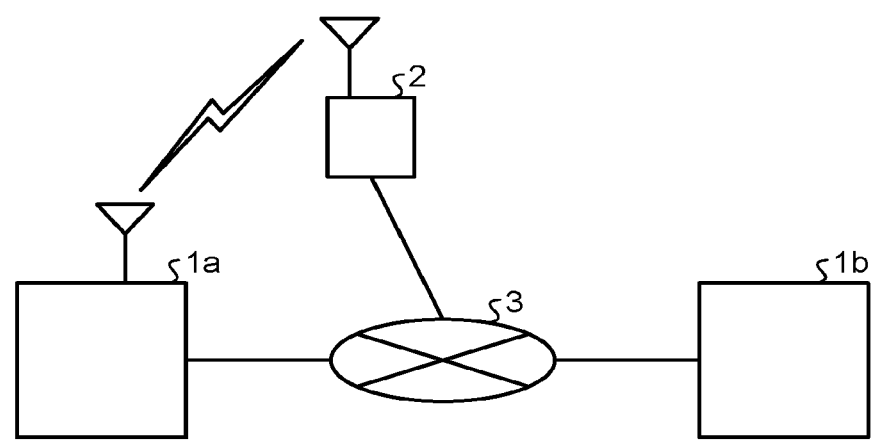
FIG. 17 illustrates an exemplary configuration of devices in a system according to the present embodiment.

FIG. 17 illustrates an exemplary configuration of devices in a system according to the present embodiment. The system in FIG. 17 includes a computer 1a, a computer 1b, a base station 2, and the network 3. The computer 1a is connected with the network 3 through wireless or wired communication, the network 3 being connected with the computer 1b.

The encoding unit 100a and the decoding unit 100b illustrated in FIG. 3 may be included in either the computer 1a or the computer 1b illustrated in FIG. 17. Alternatively, both the encoding unit 100a and the decoding unit 100b may be included in each of the computer 1a and the computer 1b.

The following describes a part of a modification of the above-described embodiment. In addition to the following modification, a design change not departing from the scope of the present invention may be performed as appropriate. The encoding processing may be performed on, for example, a monitoring message output from the system in addition to data in a file. For example, a monitoring message sequentially stored in a buffer is encoded by the above-described encoding processing and stored as a log file. For example, compression may be performed page by page in database or performed on a plurality of pages as a whole.

Target data of the above-described encoding processing is not limited to character information as described above. The above-described compression processing may be applied to information including a numerical value only, or image and sound data, for example. Since a file having a large amount of data obtained through sound synthesis includes a large number of repetitions in the data, for example, the compression ratio is expected to increase with the use of the dynamic dictionary. In addition, a moving image captured by a fixed camera includes a large number of repetitions because images are similar between frames. Thus, application of the above-described encoding processing can achieve the same effects as those obtained for document data and sound data.

The present invention can encode a string as a whole even after words are individually encoded, thereby improving compression efficiency.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A non-transitory computer-readable recording medium having stored therein an encoding program that causes a computer to execute a process comprising:
   detecting a duplicating part in an encoding target and a first plurality of words in an encoded output, by comparing a particular unit in the encoding target and the first plurality of words that are encoded in the encoded output, the particular unit including a second plurality of words, when encoding the encoding target from an input text;
   encoding the duplicating part in the encoding target to an first dynamic code by a dynamic encoding; and
   replacing a first encoded part including the duplicating part in the encoded output to the first dynamic code.

2. A non-transitory computer-readable recording medium according to claim 1, wherein the process further comprises registering the detected duplicating part and a registration number in association with each other in a dynamic dictionary and the encoding replaces the detected duplicating part with the registration number in the dynamic dictionary.

3. A non-transitory computer-readable recording medium according to claim 1, wherein the process further comprises generating a bit map associating n sequential words included in the text with file identification information for identifying a file including information obtained by encoding the n sequential words, when encoding the input text word by word and outputting the encoded input text to the output buffer and the detecting detects the duplicating part based on the bit map.

4. An encoding method executed by a computer, the method comprising:
   detecting a duplicating part in an encoding target and a first plurality of words in an encoded output, by comparing a particular unit in the encoding target and the first plurality of words that are encoded in the encoded output, the particular unit including a second plurality of words, when encoding the encoding target from an input text;
   encoding the duplicating part in the encoding target to an first dynamic code by a dynamic encoding; and
   replacing a first encoded part including the duplicating part in the encoded output to the first dynamic code.

5. The encoding method according to claim 4, wherein the method further comprises registering the detected duplicating part and a registration number in association with each other in a dynamic dictionary and the encoding replaces the detected duplicating part with the registration number in the dynamic dictionary.

6. The encoding method according to claim 4, wherein the method further comprises generating a bit map associating n sequential words included in the text with file identification information for identifying a file including information obtained by encoding the n sequential words, when encoding the input text word by word and outputting the encoded input text to the output buffer and the detecting detects the duplicating part based on the bit map.

7. An encoding device comprising:
   a processor that executes a process comprising:
   detecting a duplicating part in an encoding target and a first plurality of words in an encoded output, by comparing a particular unit in the encoding target and the first plurality of words that are encoded in the encoded output, the particular unit including a second plurality of words, when encoding the encoding target from an input text;
   encoding the duplicating part in the encoding target to an first dynamic code by a dynamic encoding; and
   replacing a first encoded part including the duplicating part in the encoded output to the first dynamic code.

8. The encoding device according to claim 7, wherein the process further comprises registering the detected duplicating part and a registration number in association with each other in a dynamic dictionary and the encoding replaces the detected duplicating part with the registration number in the dynamic dictionary.

9. The encoding device according to claim 7, wherein the process further comprises generating a bit map associating n sequential words included in the text with file identification information for identifying a file including information obtained by encoding the n sequential words, when encoding the input text word by word and outputting the encoded input text to the output buffer and the detecting detects the duplicating part based on the bit map.

10. A non-transitory computer-readable recording medium having stored therein a decoding program that causes a computer to execute a process comprising:
    acquiring encoded data; and
    decoding the encoded data based on dynamic dictionary information associating a registration number with a duplicating part that includes a particular unit including a plurality of words included in a text yet to be encoded into the encoded data and that is detected by comparing the particular unit and each word corresponding to the encoded data.

11. A decoding method executed by a computer, the method comprising:
    acquiring encoded data; and
    decoding the encoded data based on dynamic dictionary information associating a registration number with a duplicating part that includes a particular unit including a plurality of words included in a text yet to be encoded into the encoded data and that is detected by comparing the particular unit and each word corresponding to the encoded data.

12. A decoding device comprising:
    a processor that executes a process comprising:
    acquiring encoded data; and
    decoding the encoded data based on dynamic dictionary information associating a registration number with a duplicating part that includes a particular unit including a plurality of words included in a text yet to be encoded into the encoded data and that is detected by comparing the particular unit and each word corresponding to the encoded data.

* * * * *